United States Patent [19]
Heberle

[11] Patent Number: 5,146,210
[45] Date of Patent: Sep. 8, 1992

[54] WIRELESS REMOTE CONTROL SYSTEM FOR A TELEVISION RECEIVER

[75] Inventor: Klaus Heberle, Reute, Fed. Rep. of Germany

[73] Assignee: Deutsche ITT Industries GmbH, Freiburg, Fed. Rep. of Germany

[21] Appl. No.: 558,261

[22] Filed: Jul. 26, 1990

[30] Foreign Application Priority Data

Aug. 22, 1989 [EP] European Pat. Off. ........ 89115455.1

[51] Int. Cl.[5] .............................................. G09G 1/00
[52] U.S. Cl. .................................... 340/709; 340/706; 340/712; 358/194.1; 359/142
[58] Field of Search ...................... 455/663; 358/194.1, 358/183; 340/706, 709, 712, 825.72; 341/176; 359/142, 159

[56] References Cited

U.S. PATENT DOCUMENTS 4,565,999 1/1986 King et al. ........................ 340/706
4,745,402 5/1988 Auerbach ........................... 340/709
4,959,721 9/1990 Micic et al. ........................ 340/709

OTHER PUBLICATIONS

IEEE Transactions on Consumer Electronics "1988 International Conference on Consumer Electronics, Part 1" 34 (1988) Aug., No. 3, New York, N.Y., USA.

Primary Examiner—Ulysses Weldon
Assistant Examiner—Jick Chin
Attorney, Agent, or Firm—Thomas L. Peterson

[57] ABSTRACT

A system for remotely controlling a television receiver has a position-dependant transmitter and an electrooptical arrangement which controls the motion of a cursor on a television screen. The electrooptical arrangement also generates menu entries to facilitate the selection of functions for tuning and operating the television receiver. The menu entries are selected by means of the cursor. The electrooptical arrangement includes adaptive filters which stabilize the position of the cursor on the screen and thereby allow for an increased number of control functions to be implemented.

16 Claims, 3 Drawing Sheets

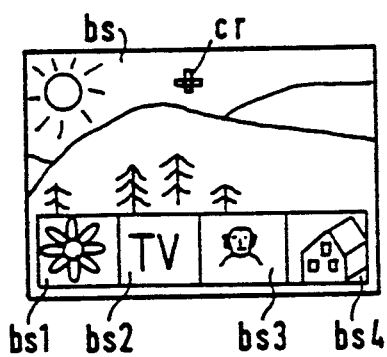
FIG.5a
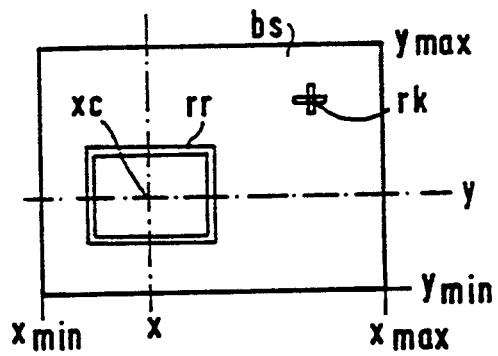
FIG.5b
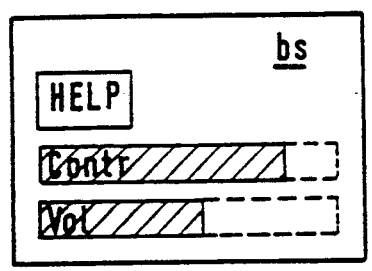
FIG.5c
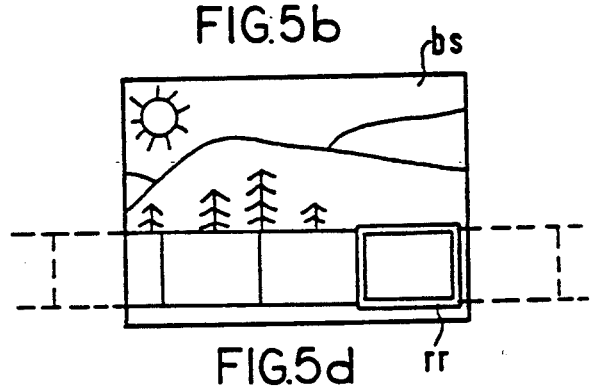
FIG.5d
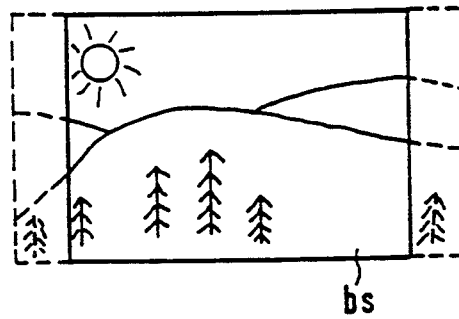
FIG.5e
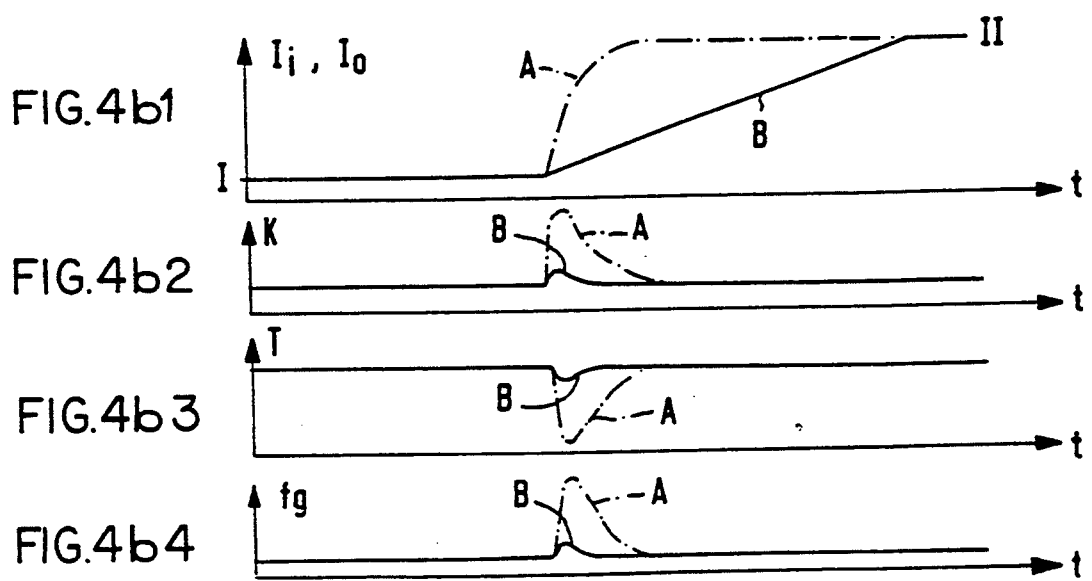
FIG.4b1
FIG.4b2
FIG.4b3
FIG.4b4

WIRELESS REMOTE CONTROL SYSTEM FOR A TELEVISION RECEIVER

BACKGROUND OF THE INVENTION

The present invention relates to a remote control system for video display apparatus, and more particularly to a remote control system having a position-dependant transmitter, an electrooptical loop which controls the motion of a cursor on a television screen, adaptive filters, forming a part of the electrooptical loop, which stabilize the position of the cursor o on the screen, and a menu controller which generates menu entries for selecting functions for tuning and operating the television receiver.

Remote control devices provide a convenient means for controlling video display apparatus such as television sets, video recorders and personal computers. Because the video display apparatus typically contains a large number of tuning and operational functions, remote control can become complicated, especially from a distance. To control the large number of functions required by the video display apparatus, an interactive mode is provided in which a user selects the desired function from a succession of menus. Each menu provides symbols and fields which correspond to functions such as volume. The user simply selects the desired function by positioning the cursor within a field.

The position of the cursor is typically controlled by the remote control device. One such remote control system is disclosed by application Ser. No. 07/450,971, filed by Heberle on 12/15/89 and assigned to ITT Corporation, which is entitled "ELECTROOPTICAL POINTING DEVICE FOR REMOTELY CONTROLLING ELECTRONIC APPARATUS" and which is incorporated herein by reference. There, an electrooptical arrangement determines the relative motion of a cursor on a television screen by evaluating the relative angular positions of a transmitter in different reference planes with respect to a reference line between the transmitter and the television receiver. The transmitter is formed by three sources of radiation whose signals are emitted along three parallel optical axes. Each axis determines a reference plane. Two sources have rising/falling radiation patterns. The third source, which provides a reference signal, has a flat radiation pattern. The electrooptical arrangement, located at the front of the television receiver, detects the radiation patterns, determines tilting of the transmitter by evaluating the relation between signal intensities of the three . radiation patterns, and generates reference signals which correspond to the tilt angles in the vertical or horizontal directions. Thus, the combined evaluation of the two directions of tilting permits continuous motion control in any direction on the screen. Analog functions can be controlled by the relative motion of the cursor. For instance, a slider control for volume is displayed symbolically by a bar. To increase or decrease volume, the bar is either lengthened or shortened by the motion of the cursor.

Since the position of the cursor is dependant upon the motion of the transmitter, it becomes apparent that an unsteadiness in the hand of a user has a negative effect on the cursor position. A resulting high frequency jitter of only a few hertz causes the cursor to jump around the screen. Even if in small excursions, this jitter prevents the user from positioning the cursor precisely within a field on the screen. The prior art has approached this problem by increasing the area of the field for each menu entry. However, this method has the unwanted effect of reducing the number of functions available on the screen. Alternately, a lowpass filter is employed to suppress the high frequency jitter. However, a lowpass filter degrades the overall performance of the remote control since the cursor follows the course adjustment sluggishly.

SUMMARY OF THE INVENTION

The problems and disadvantages associated with remote control devices is overcome by the present invention, which relates to a new and improved system for remotely controlling a video display apparatus which displays at least one video signal on a screen. The system comprises a transmitter and an electrooptical arrangement, which controls the video apparatus by moving a cursor on the screen in response to the motion of the transmitter. The transmitter transmits a command signal containing at least one coded command and a plurality of positional signals having radiation intensities indicative of the motion of the transmitter means. The unsteady motion of the transmitter creates a high frequency component in each one of the positional signals.

The electrooptical arrangement includes receiving means for receiving the command signal and the plurality of positional signals; digitizing means, responsive to the receiving means, for digitizing the command signal and each one of the plurality of positional signals, the digital value of each one of the digitized positional signals being indicative of the radiation intensities of the corresponding one positional signal; adaptive filter means, responsive to the digitizing means, for filtering out the high frequency component from each one of the digitized positional signals; resolving means, responsive to the adaptive filter means, for resolving the plurality of filtered digitized positional signals into coordinate values indicative of the position of the cursor on the screen; and a menu controller for processing the command signal and, in accordance with the coordinate values determined by the resolving means, for displaying the position of the cursor on the screen and for controlling the video display apparatus.

While allowing analog functions to be controlled by the relative motion of the cursor, the present invention also lends itself to selecting fields based upon the absolute position of the cursor. Since the positional signals are independent of the distance between the transmitter and the electrooptical arrangement, they can be scaled to obtain coordinate values which correspond to positions on the screen. Through this position dependent control, a highly effective control means is made available to the user by assigning absolute coordinate values to different menu fields.

BRIEF DESCRIPTION THE FIGURES

FIG. 4a is a schematic block diagram of a hardware realization of an adaptive filter forming a part of the electrooptical arrangement illustrated in FIG. 1;

Figure 1:
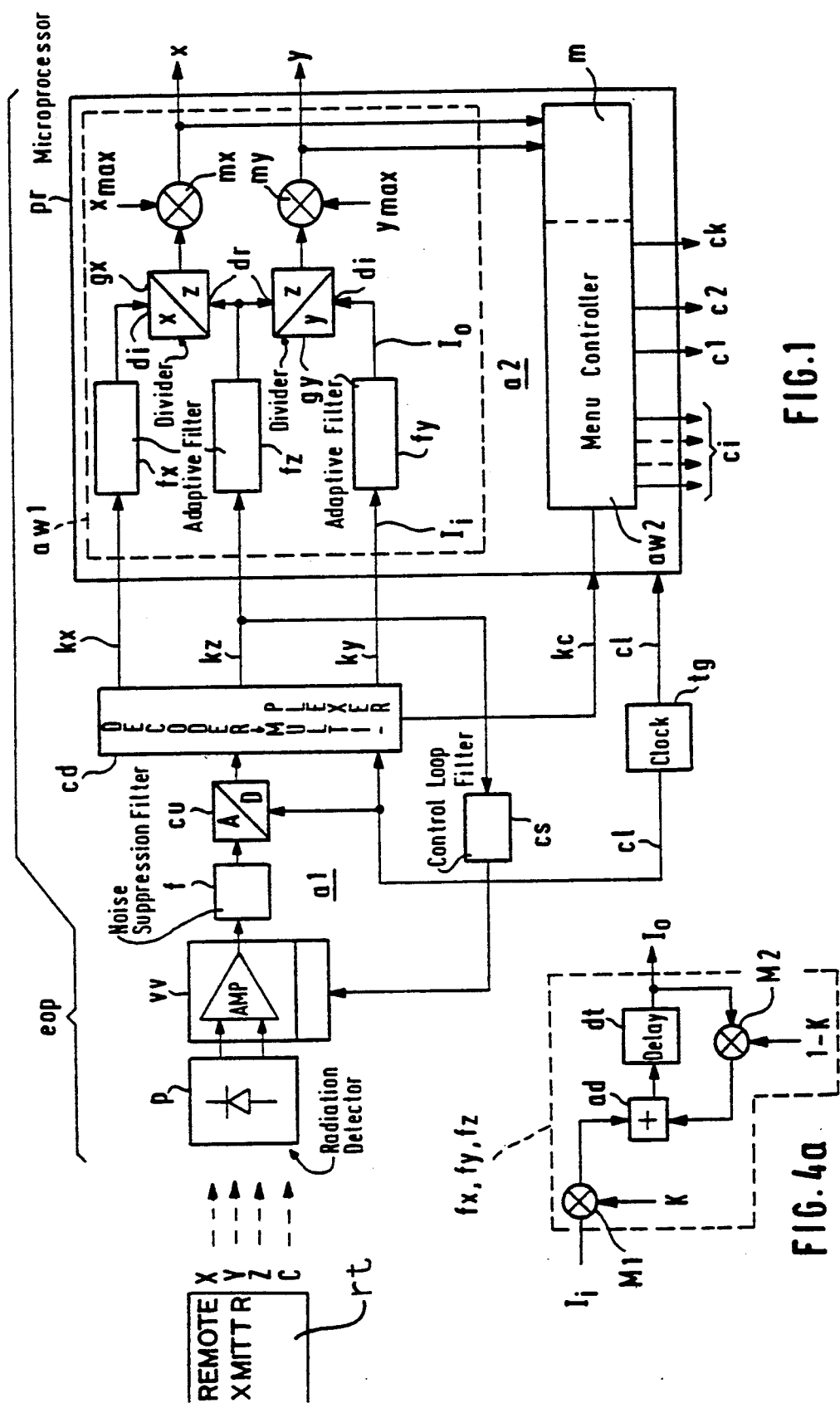
FIG. 1 is a schematic block diagram of an electrooptical arrangement constructed in accordance with the present invention.

FIG. 4b1–4b4 depict a series of timing diagrams illustrating the operation of the adaptive filter shown in FIG. 4a; and FIGS. 5a–5e are pictorial representations of a television screen controlled by the present invention.

DETAILED DESCRIPTION OF THE FIGURES

Although the present invention is applicable to many different types of electronic apparatus, it is especially suitable to be adapted for use with video display apparatus, such as television receivers. Accordingly, the present invention will be described in connection with a television receiver.

The present invention includes the remote control transmitter disclosed in application Ser. No. 07/450,971 filed on Dec. 15, 1989, which has already been incorporated herein by reference and shown in FIG. 1. The remote control transmitter rt transmits three sources of radiation, hereinafter referred to as positional signals X, Y and Z, whose patterns have different intensity distributions in three spatial planes. The positional signals X, Y and Z define the position of a cursor on a television screen. The remote control transmitter is provided with a keyboard and coding circuit to produce a coded signal C, which corresponds to control commands. Among the commands is a click command, which will be described hereinafter. The positional signals X, Y and Z and the coded signal C are transmitted in a time-division multiplex mode. In alternate embodiments, the positional signals X, Y, Z and C are transmitted on an infrared frequency. However, the signals X, Y, Z and C can be transmitted on frequencies other than infrared, including visible light and microwave.

Referring now to FIG. 1, there is shown an electrooptical arrangement eop having a radiation detector p that receives the coded signal C and the positional signals X, Y and Z from the remote transmitter rt, and converts them into a single, multiplexed analog signal. In the preferred embodiment, the radiation detector p contains an infrared-receiving diode. The analog output of the radiation detector p is amplified by variable-gain amplifier vv and filtered by a noise suppression filter f. The suppression filter f removes interference in the optical transmission path, which is caused by signal noise and spurious signals. The analog output of the noise suppression filter f is converted to a digital signal by an analog-to-digital (A/D) converter cu. A decoder circuit cd separates the output of the A/D converter cu into three component signals kx, ky and kz and the coded command signal kc. The three component signals kx, ky and kz correspond to the positional signals X, Y and Z, respectively. In the preferred embodiment, the decoder cd is a multiplexer which is controlled by a clock signal cl generated by clock generator tg.

The component signal kz is fed through a control-loop filter cs to provide a feedback signal for the variable-gain amplifier vv. The gain of the amplifier vv is digitally variable within a wide range. This is required in order to compensate for variations in absolute intensity of the positional signals X, Y and Z arising from changes in the distance between the remote control transmitter and the electrooptical arrangement eop. As the distance between the remote control transmitter and electrooptical arrangement eop is increased, the amplitude of the positional signals X, Y and Z is decreased. Without the variable gain amplifier vv, the A/D converter cu would not be able to quantize the small amplitudes of the positional signals, primarily because the A/D converter cu employs only a few quantization levels.

The three component signals kx, ky and kz are fed to adaptive filters fx, fy and fz, respectively, which remove the high frequency jitter component, caused by the unsteadiness of the users hand. A detailed description of the adaptive filter fx, fy and fz will be provided with a discussion of FIG. 4a. The adaptive filters fx, fy and fz can be realized in hardware. However, since a programmable microprocessor pr is already provided, and since the rate of change of signals kx, ky and kz is slow in comparison to the frequency of the clock signal cl, it is more practical to realize the adaptive filters fx, fy and fz through software. Thus, the component signals kx, ky and kz are input directly to the microprocessor pr, where the high frequency jitter components are removed.

An evaluation circuit awl, realized by software in the microprocessor pr, processes the outputs of the adaptive filter circuits fx, fy and fz to obtain the x- and y-coordinate values x and y, which correspond to the position of the cursor on the screen. The x-coordinate x is obtained by .evaluating the relative intensity differences in a horizontal direction between the filtered components kx and kz. A first divider gx divides the filtered component signal kx (the dividend) by the filtered component signal kz (the divisor). The resulting output of the first divider gx provides a scale factor variable having a value between zero and unity. A first multiplier mx multiplies the output of the first divider gx by a constant xmax, which corresponds to the width of the screen. The resulting output of the first multiplier mx provides the x-coordinate x. Similarly, the y-coordinate y is obtained by evaluating the relative intensity differences in a vertical direction between the components ky and kz. A second divider gy divides the filtered component signal ky by the filtered component signal kz, and a second multiplier my multiplies the output of the second divider gy by a constant ymax to provide the y-coordinate y. Constant ymax corresponds to the height of the screen. Thus, the x- and y-coordinate values x and y are obtained by multiplying the respective maximum coordinate values xmax and ymax by their respective scale factors. It can be appreciated that the selection of maximum coordinate values xmax and ymax determines the range over which the cursor is moved. For instance, if the selected values for xmax and ymax are less than actual width and height of the screen, the cursor would be moved over only a portion of the screen. If, on the other hand, the selected values for xmax and ymax are greater than actual width and height of the screen, the cursor could be moved outside the screen in an invisible, yet defined manner.

A menu controller m, also realized by software in microprocessor pr, decodes the coded command signal kc into a click command ck, which command causes the current coordinate values x and y of the cursor to be stored into microprocessor memory, first and second trigger signals c1 and c2, which activate character generators zg1 and zg2, respectively (see FIG. 2), and a plurality of additional commands $c_i$, which are fed to additional subcircuits (not shown). The menu controller m also displays a variety of menu entries on the screen and generates command signals in response to the selection of the menu entries. The menu entries are selected by positioning the cursor within a menu field and actuating the click command key on the transmitter. The display functions will be described in greater detail in FIG. 2.

It has been noted that the evaluation circuit awl and menu controller m are realized by the microprocessor pr. The selection of a particular type of microprocessor is left to those skilled in the art. Furthermore, the general principles of construction of microprocessors are well known to those skilled in the art, and apart from their specific application to provide control called for by the present invention, are not described in detail herein.

Figure 2:
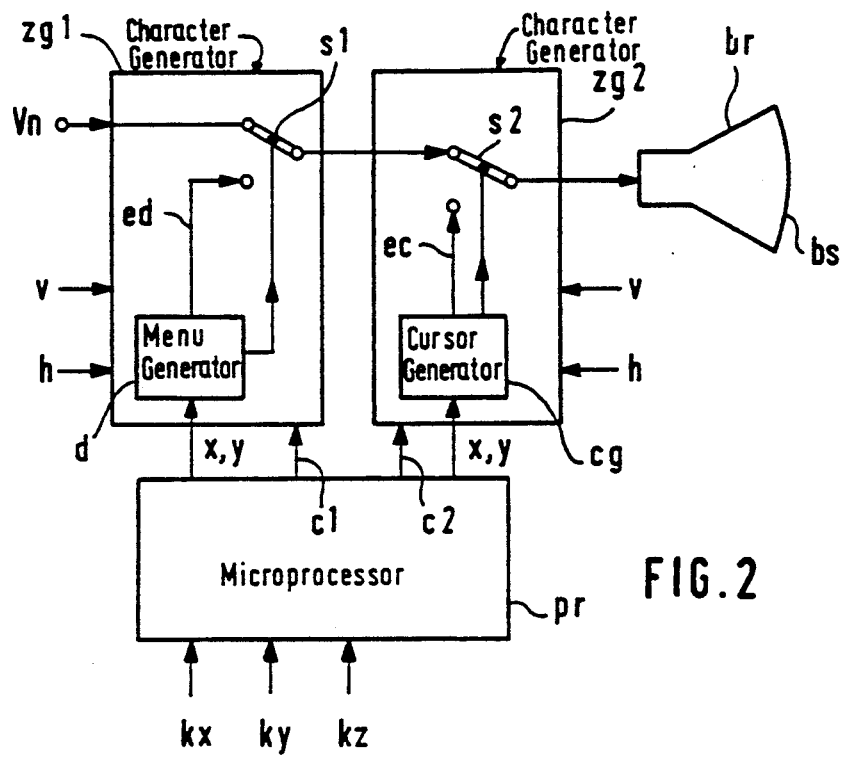
FIG. 2 is a schematic block diagram of first and second character generators which receive signals generated by the electrooptical arrangement illustrated in FIG. 1.

With reference to FIG. 2, conductor Vn provides the screen bs of a picture tube br with the red, green, and blue components of a television signal. First and second character generators zg1 and zg2, function to impose a menu and cursor, respectively, over the television picture. The first character generator zg1 includes a menu generator d that applies an output signal to conductor ed, which signal contains fixed and continuously adjustable operating parameters that define the menu. Exemplary menus are illustrated in FIGS. 5a and 5c. Such menu operations are well known, and can be implemented, through software, by a person skilled in the art. For example, FIG. 5c shows a menu on the TV screen for a contrast and volume control and which menu display can be found on many prior art receivers. The second character generator zg2 includes a cursor generator cg that applies an output signal to conductor ec, which signal defines the cursor. The menu and cursor generators d and cg form a part of the menu controller and are realized by software in the microprocessor pr. The software required' to generate the signals which display the cursor and menus can be developed by a person skilled in the art.

The first and second character generators zg1 and zg2 are connected such that the output signal generated by the cursor generator cg has a higher priority for reproduction than the output signal generated by the menu generator d. Conductor Vn and conductor ed are coupled to respective inputs of a first multi-wafer switch sl. The output conductor of the first multi-wafer switch sl and conductor ec are coupled to respective inputs of a second multi-wafer switch s2. The output of the second multi-wafer switch s2 is coupled to the picture tube br. The multi-wafer switches sl and s2, which are known to those skilled in the art, allow for fast switching between the television signal and the on-screen video display. Thus, character generator zg1 generates a menu which is imposed over the television picture, and character generator zg2 generates a cursor which is imposed over the television picture and the menu.

The first and second character generators zg1 and zg2 are activated by first and second trigger signals cl and c2, respectively, and are controlled by the coordinate values x and y, and by the vertical and horizontal clock signals v and h. The first and second trigger signals cl and c2 and the coordinate values x and y are issued by control processor pr. The vertical and horizontal clock signals v and h, which are known to indicate the start times of the vertical and horizontal deflection, respectively, of the picture tube electron beam, are issued by a deflection-synchronizing circuit (not shown).

Figure 3A:
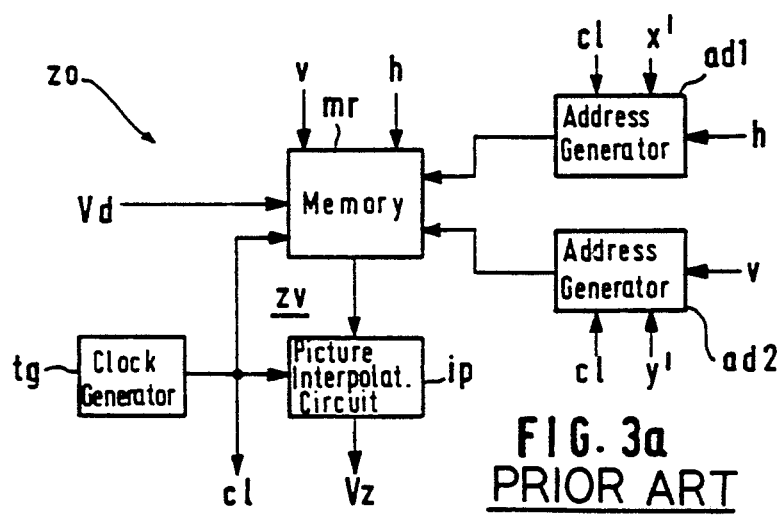
FIG. 3a is a schematic block diagram of a zoom circuit controlled by the electrooptical arrangement illustrated in FIG. 1.

Referring now to FIG. 3a, there is shown a zoom circuit zo, which enlarges a portion of the television picture displayed on the screen bs. A digitized video signal Vd is written into a memory mr. The storage capacity of memory mr must sufficient to store at least one line of a video frame. In the preferred embodiment, however, memory mr has the capacity to store an entire video frame. The write addresses are controlled by the horizontal and vertical clock signals h and v, and by the system clock signal cl, which is issued by clock generator tg.

During reproduction of the enlarged picture, only a portion of the data stored in memory mr is read out. The addresses that are read out, particularly the modified start addresses, are generated by first and second address generators adl and ad2. The first address generator, which generates the addresses for the x-coordinate, is controlled by the system clock signal cl, a modified x-coordinate value x', and the horizontal clock signal h. The second address generator ad2, which generates the addresses for the y-coordinate, is controlled by the system clock signal cl, a modified y-coordinate value y', and the vertical clock signal v.

The data that is read out of memory mr is interpolated by a picture interpolation circuit ip. If, for example, the television picture is to be enlarged by one third in th.e horizontal direction, every third picture element must be read out twice and then must be suitably interpolated. Correspondingly, if the picture is to be enlarged by one third in the vertical direction, every third line must be read out twice and then must be interpolated. The output of the interpolation circuit ip is the zoom video signal Vz, which is sent to the screen bs. Thus, the zoom video signal Vz, which contains a portion of the data stored in memory mr, is displayed on the full screen bs. Such zoom circuits are well known to those skilled in the art.

Figure 3B:
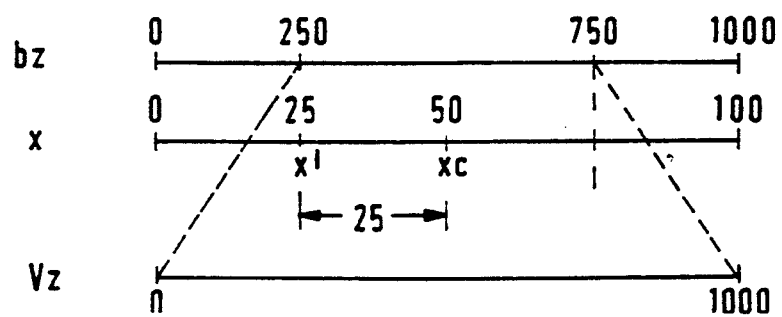
FIG. 3b is a diagram illustrating the stretching of a stored picture line.

FIG. 3b shows schematically how the stretching of the stored picture line bz is related to the x-coordinate values x, to the modified cursor position x', and to the stretched zoom video signal Vz. There, the screen bs is divided into 100 x-coordinate values, and one thousand picture elements per picture line bz are stored in one thousand memory locations of memory mr. By setting the x-coordinate value of the cursor-frame center xc to fifty, such that the cursor frame is located in the middle of the screen bs, a central memory area is read out. For instance, with a linear enlargement by a factor of 2 and with a scale factor of ten, the zoom circuit zo determines the desired start address for horizontal readout subtracting a value of twenty-five (half the frame width) from the horizontal cursor position xc. Thus, the horizontal picture elements are read from memory location two hundred and fifty to location seven hundred and fifty.

The zoom circuit zo operates as follows. When a wide-screen film, which has an aspect ratios differing considerably from that of the standard 4:3 aspect ratio, is reproduced on the screen bs, there are black stripes at the top and the bottom. The zoom circuit uses a predetermined first enlargement factor to reproduce the number of lines such that the television picture gives a full-screen display. The zoom circuit zo enlarges the picture by reproducing only x-coordinate value x, as determined by the position-dependant remote-control transmitter. Note that this is accomplished without the click command ck. Also note that the cursor generator cg does not generate a rectangular frame rr on the screen bs. Similarly, if the television picture does not have the standard 4:3 aspect ratio, the zoom circuit zo has a fixed second enlargement factor which brings the received television picture to a number of lines giving a full-screen display. First, of course, the corresponding television signals must be converted to the baseband by a suitable receiving and decoding device, and a suitable frame memory mr must be made available. The portion to be enlarged is then determined only by the x-coordinate value x, without the aid of the click command ck. Again, the cursor generator cg does not generate a rectangular frame rr. The picture portion to be enlarged is selected simply by swinging the remote-control transmitter horizontally.

One special case for the zoom circuit zo is where the received television picture does not have the standard 4:3 aspect ratio, but does contain the standard number of lines. Twice the number of lines is permissible. Instead of providing a memory mr which has the capacity to store an entire video frame, it is only necessary to provide a memory mr which has the capacity to store the contents of a single line received. A section of the stored line is stretched to the full screen width by means of the interpolation circuit ip. In this specific case, the enlargement factor of the zoom circuit zo is unity.

Referring now to FIG. 4a, there is shown a hardware realization of adaptive filters fx, fy and fz. Each adaptive filter $f_x$, $f_y$ and $f_z$ includes first and second multipliers M1 and M2, an adder ad and a delay element dt. Conductors carrying the input signal Ii and the variable filter coefficient K are coupled to respective inputs of first multiplier M1. The output of first multiplier M1 is coupled to one input of adder ad. The output of adder ad is coupled to the input of delay element dt which delays the signal by at least one full sampling period. The output of the delay element dt provides the output signal Io. To the second input of adder ad, a feedback signal is applied, which consists of the product of the output signal Io and a weighting factor $1-K$, which is formed by the second multiplier M2. Although the adaptive filter is shown in FIG. 4a as a hardware representation, it is most conveniently realized through software in the control microprocessor pr.

Each adaptive filter fx, fy and fz illustrated in FIG. 4a realizes the following algorithm:

$$Ii = [(1-K)Io + KIi]z^{-N}$$

where $z^{-n}$ corresponds to the delay element dt and represents a delay time of a number n of sampling periods, where n is an integer having the value of at least one; and variable coefficient K is a weighting factor having a value not greater than unity, such that small values of K result in a low cutoff frequency, and large values of K result in a high cutoff frequency. The filter coefficient K is determined by the following equation:

$$K = (K\,max - K\,min)\,absolute\,(Ii-Io)/I\,max + K\,min$$

where K max and K min are the upper and lower limits, respectively, of the filter coefficient K; and I max is the upper limit of filter input Ii, which depends essentially on the resolution bandwidth of the analog-to-digital converter cu. The values for K max, K min and I max, which are stored in the memory of microprocessor pr, determine the range of the cutoff frequency of the adaptive filter fx, fy or fz.

During operation, each adaptive filter fx, fy and fz eliminates the high frequency jitter component caused by the unsteadiness of a user's hand during adjustment of the cursor. Further, the filter distinguishes between the jitter component and the interference in the optical transmission path, which is caused by signal noise or spurious signals, e.g., the beam chopping frequency. As one can ascertain from the algorithm, the difference in values between the input signal Ii and output signal Io are employed in a feedback loop which adjusts the value of the output signal Io.

Referring now to FIG. 4b, a timing diagram illustrates the operation of the adaptive filters fx, fy and fz. FIG. 4b1 shows two scenarios in which the values for the input and output signals Ii and Io are varied. In scenario A, shown in dash, the cursor is moved quickly from a first position I to a distant second position II. The quick motion, which represents jitter, causes a large difference in values between the input and output signals Ii and Io. Because the value of the filter coefficient K is linearly dependant on the absolute value of the difference between Io and Ii, the value for filter coefficient K increases. Resulting is a corresponding decrease in filter time constant T (see FIG. 4b3), and a corresponding increase in cutoff frequency fg (see FIG. 4b4). As the motion is slowed, value of filter coefficient K is decreased, the corresponding filter time constant T is increased, and the corresponding cutoff frequency fg is decreased. Thus, the associated cutoff frequency fg, shown in FIG. 4b4, jumps during the quick movement of the cursor from a low value to a high value and falls off again as the displayed cursor (actual value) approaches its set position value (desired value).

In scenario B, shown in solid, the cursor is moved more slowly from first position I to second position II. The slower motion causes a smaller difference in values between the input and output signals Ii and Io. As a result, the filter coefficient K, the filter time constant T (see FIG. 4b3), and the cutoff frequency fg (see FIG. 4b4) exhibit less change. Thus, small, but fast jittering movements are effectively suppressed by the low cutoff frequency of the adaptive filter, while slow, large cursor movements cause the adaptive filter to sample at higher frequencies. As a result, the cursor easily follows every movement of an unsteady hand such that it can be finely adjusted on the screen.

Referring now to FIG. 5, there are shown five examples of how the present invention facilitates the remote control of a television receiver. Referring first to FIG. 5a, one television program is shown on a main screen bs, and four additional television programs are displayed in four menu filed insets bs1-bs4 using a conventional multipicture display technique. By moving cursor cr to one of the four smaller menu fields and depressing the click command key on the transmitter, the corresponding program is selected as the main program, and is displayed on the main screen bs.

In FIG. 5b, the cursor is illustrated on the screen bs as a cross rk and as a rectangular frame rr. The center xc of the frame rr is defined by the cursor coordinates x and y. The values of the maximum coordinates xmax and ymax are defined within the bounds of the screen bs; however, maximum coordinates located outside the screen may instead be defined. A television picture is shown on the main screen and an additional television program is contained within the frame rr. By actuating the transmitter key for the click command ck, the small inset picture is "attached" to the frame rr. By moving rectangular frame rr, the position of a small inset picture is freely moved on the screen. By means of the next click command ck, the inset picture is "released" by the frame rr at the desired position. In this mode, the microprocessor pr changes the respective write addresses of the large and small pictures in a frame memory mr via the x- and y- coordinate values x, y of the cursor.

Referring to FIG. 5c, a screen bs displays symbolic representations of analog functions which are generated by the first character generator zg1. The lower bars Vol and Contrl, whioh are variable in length, symbolically represent slider controls for volume and contrast, respectively. The menu field HELP, located above the two bars, initiates a help function which allows a user to select the desired control function in an interactive mode.

In FIG. 5d, there is shown another means of selecting programs with the aid of the frame rr. Here, the various programs are sequentially displayed in the fields. For example, channels 2 and 3 are shown in the first three fields. Further, channels 4, 5 and 6 are shown in the following three fields, which are off the screen. Thus, a chain is formed. Using the frame rr and the click command ck, this chain is "seized" at an arbitrary point and advanced or retracted until the desired program appears in the displayed frame rr. By actuating a further click command ck, the desired program is then selected and transferred to the main screen bs.

In FIG. 5e, the television picture displayed on the screen bs has an aspect ratio that is different from that of the screen bs. As a result, only a portion of the television picture is displayed, with the flanks being clipped off. To display either flank of the picture, the remote-control transmitter is swung to the left or the right, which has the effect of swinging the entire picture, including the flanks, to the left or the right. In this manner, one flank is displayed. Similarly, if the television receiver is provided with a zoom circuit zo, the detail to be enlarged can be determined simply by swinging the remote-control transmitter.

This specific embodiment of the present invention is intended to be illustrative only. It will be understood that many variations and modifications can be made to the present invention by those of ordinary skill in the art. Therefore, it is manifestly intended that this invention be only limited by the claims and the equivalents thereof.

I claim:

1. A system for remotely controlling a video display apparatus having a screen for displaying at least one video signal, said system comprising:
   transmitter means for transmitting a plurality of electromagnetic positional signals having radiation intensities indicative of the motion of said transmitter means, and for transmitting an electromagnetic command signal containing at least one coded command, wherein an unsteady motion of said transmitter means creates a high frequency component in each one of said plurality of positional signals; and
   electrooptical means responsive to said transmitted electromagnetic positional signals for controlling said video apparatus by moving a cursor on the screen in response to the motion of said transmitter means, said electrooptical means including:
   receiving means for receiving said command signal and said plurality of positional signals;
   digitizing means, responsive to said receiving means, for digitizing said command signal and each one of said positional signals, the digital value of each one of said digitized positional signals being indicative of the radiation intensities of said correspondign one positional signal;
   adaptive filter means, responsive to said digitizing means, for filtering out said high frequency component from each one of said digitized positional signals;
   resolving means, responsive to said adaptive filter means, for resolving said plurality of filtered digitized positional signals into coordinate values indicative of the position fo the cursor on the screen; and
   menu controller means for processing said command signal and, in accordance with said coordinate values determined by said resolving means, for displaying the position of the cursor on the screen and for controlling said video display apparatus.

2. A system according to claim 1, wherein said adaptive filter means increases its cutoff frequency in response to increases in the frequency of said digitized positional signal and wherein said adaptive filter means decreases said cutoff frequency in response to decreases in the frequency of said digitized positional signal.

3. A system according to claim 2, wherein each one of said adaptive filter means operates on a corresponding digitized positional signal (Ii) according to the algorithm:

$$Ii=[(1-K)Io+KIi]^{z-n}$$

4. A system according to claim 3, wherein each one of said adaptive filters means includes an adder means, a first multiplier means for multiplying the digitized positional signal (Ii) by the variable filter coefficient (K), the output of said first multiplier being coupled to one input of said adder means, delay element means for delaing the output of said adder means by at least oen full sampling period, the output of said delay element means providing the output (Io) of said adaptive filter means, and a second multiplier means for multiplying the output of the delay element means by the value $1-K$, the output of said second multiplier being coupled to another input of said adder means.

5. A system according to claim 3, wherein said electrooptical means includes a programmable microprocessor, and wherein said algorithm is programmed in said programmable microprocessor, whereby said programmable microprocessor performs the adaptive filtering operation.

6. A system according to claim 3, wherein the weighting factor (K) is determined by the equation:

$$K=(K\,max-K\,min)\,absolute\,(Ii-Io)/I\,max+K\,min$$

7. A system according to claim 1, wherein said plurality of positional signals includes first, second and third positional signals, wherein said first and second positional signals have varying radiation patterns, wherein said third positional signal has a flat radiation pattern and wherein said first, second and third positional signals are time-division multiplexed.

8. A system according to claim 7, wherein said first second and third positional signals are transmitted along first, second and third optical axes, respectively, said optical axes being aligned in parallel, each one of said first, second and third optical axes determining a reference plane, and wherein said first and second electromagnetic signals have monotonically rising/falling radiation patterns.

9. A system according to claim 7, wherein said receiving means includes a radiation detector means for receiving said command signal and said first, second and third positional signals and for providing a single analog output signal, and wherein said digitizing means includes an analog to digital converter means for converting said analog output signal into a digital output signal and decoder means for separating said digital output signal into a digitized command signal and digitized first, second and third positional signals.

10. A system according to claim 9, wherein said receiving means further includes variable amplifying means interposed between said radiation detector means and said analog to digital converter means for amplifying said analog signal by a gain factor, said gain factor being responsive to changes in the value of said digitized third positional signal.

11. A system according to claim 10, wherein said command si.gnal includes a click command, and wherein the coordinates of the cursor are stored in said memory controller at the time said click command is issued.

12. A system according to claim 11, wherein the screen is resolved into rectangular coordinates, and wherein said resolving means determines the movement of the transmitter means by evaluating the relation between signal intensity values of said digitized first, second and third positional signals, and generates rectangular coordinates which correspond to the position of the cursor on the screen.

13. A system according to claim 12, wherein a value ymax corresponds to the height of the screen and a value xmax corresponds to the width of the screen, wherein said resolving means includes a first divider means for dividing the filtered, digitized first positional signal by the filtered, digitized third positional signal, and a first multiplier means for multiplying the output of said first divider means by xmax, whereby the output of said first multiplier means is an x-coordinate value, and wherein said resolving means further includes a second divider means for dividing the filtered, digitized second positional signal by the filtered, digitized third positional signal, and a second multiplier means for multiplying the output of said second divider means by ymax, whereby the output of said second multiplier means is a y-coordinate value.

14. A system according to claim 11, wherein said menu controller means displays a video signal over a substantial portion of the screen and further displays a plurality of additional video signals in corresponding insets, each video signal corresponding to a unique television channel, and wherein one of said additional video signals is selected for display over the substantial portion of the screen by moving the cursor to the associated inset and actuating said click command.

15. A system according to claim 11, wherein said cursor is a rectangular frame and wherein said menu controller displays a portion of the video signal in said rectangular frame.

16. An electrooptical apparatus, responsive to the motion of a transmitter, for controlling a cursor on the screen of a television receiver, the transmitter transmitting a plurality of positional signals having intensities which are indicative of the motion of the transmitter, wherein an unsteady motion of said transmitter creates a high frequency component in each one of the positional signals; said apparatus comprising:
  receiving means for receiving said command signal and said plurality of positional signals;
  digitizing means, responsive to said receiving means, for digitizing said command signal and each one of said positional signals, the digital value of each one of said digitized positional signals being indicative of the radiation intensities of said corresponding one positional signal;
  adaptive filter means, responsive to said digitizing means, for filtering out said high frequency component from each one of said digitized positional signals;
  resolving means, responsive to said adaptive filter means, for resolving said plurality of filtered digitized positional signals into coordinate values indicative of the position of the cursor on the screen; and
  menu controller means for displaying the position of the cursor on the screen in accordance with said coordinate values determined by said resolving means.

* * * * *